United States Patent [19]

Mihashi et al.

[11] 4,151,011

[45] Apr. 24, 1979

[54] PROCESS OF PRODUCING SEMICONDUCTOR THERMALLY SENSITIVE SWITCHING ELEMENT BY SELECTIVE IMPLANTATION OF INERT IONS IN THYRISTOR STRUCTURE

[75] Inventors: Yutaka Mihashi; Josuke Nakata; Toshio Sogo; Kenichi Yamanaka, all of Itami, Japan

[73] Assignee: Mitsubishi Denki Kabushiki Kaisha, Tokyo, Japan

[21] Appl. No.: 924,830

[22] Filed: Jul. 14, 1978

[30] Foreign Application Priority Data

Jul. 15, 1977 [JP] Japan .................................. 52-85432

[51] Int. Cl.² .................... H01L 21/265; H01L 23/56
[52] U.S. Cl. ....................................... 148/1.5; 357/28; 357/38; 357/91
[58] Field of Search ........................... 357/28, 38, 91; 148/1.5

[56] References Cited

U.S. PATENT DOCUMENTS

| | | | |
|---|---|---|---|
| 3,929,512 | 12/1975 | Nicholas et al. | 148/1.5 |
| 4,081,818 | 3/1978 | Nakata | 357/28 |
| 4,117,505 | 9/1978 | Nakata | 357/28 |

FOREIGN PATENT DOCUMENTS

| | | | |
|---|---|---|---|
| 2461207 | 6/1976 | Fed. Rep. of Germany | 357/28 |
| 1454323 | 11/1976 | United Kingdom | 357/28 |

OTHER PUBLICATIONS

Oonishi et al., "T-Characteristics of the Thyristor . . ." Trans. Soc. Instr. & Control Engg. (Japan), 10 (1974) 507.

Primary Examiner—L. Dewayne Rutledge
Assistant Examiner—Upendra Roy
Attorney, Agent, or Firm—Wenderoth, Lind & Ponack

[57] ABSTRACT

A planar pnpn thyristor structure is prepared to include an $SiO_2$ film with a thickness of about 10,000Å wholly disposed on its main face to which pn junctions are exposed. That portion of the $SiO_2$ film underlaid with an exposed edge of a collector junction and its adjacent portion are replaced by another $SiO_2$ film about 1,000Å thick. Then argon ions $Ar^+$ with an implantation energy of 200 KeV are implanted into the thyristor structure through both films to permit a low lifetime region including a large number of lattice defects to be formed only in its main face portion overlaid with the thin $SiO_2$ film resulting in a semiconductor thermally sensitive switching element effecting the switchover at a sufficiently low temperature.

9 Claims, 6 Drawing Figures

PROCESS OF PRODUCING SEMICONDUCTOR THERMALLY SENSITIVE SWITCHING ELEMENT BY SELECTIVE IMPLANTATION OF INERT IONS IN THYRISTOR STRUCTURE

BACKGROUND OF THE INVENTION

This invention relates to a process of producing a semiconductor thermally sensitive switching element utilizing a pnpn junction.

Semiconductor thermally sensitive switching elements to which the present invention is concerned are disclosed, for example, in Japanese laid-open patent application No. 146,283/1975 and utilize the pnpn junction responsive to a temperature in excess of a predetermined magnitude to cause their OFF state to disappear thereby to be shifted to their ON state. It is well known that thyristors with the pnpn junction are widely utilized as switching element but such thyristors are permitted to be employed only within a temperature range wherein a rise in junction temperature does not cause a decrease in off-state voltage or wherein any thermal cause does not affect the turn-on. That temperature at which this rise in temperature causes the disappearance of the OFF state is far higher than a rated maximum junction temperature. Thus there have not been previously available thyristors enabled to effect the switchover at low temperatures, for example, at the temperature ranging from room temperature to 100° C. or lower by means of the thermal action.

In order to provide semiconductor thermally sensivitve switching elements effecting the switchover at such sufficiently low temperatures and low in power loss, it is required to increase the reverse leakage current through the pn junction that is reversely biased in their OFF state as described in the cited application. This can be done by disposing a low lifetime region of carriers in a portion of this pn junction. The formation of that low lifetime region has been already accomplished either by introducing atoms of a heavy metal such as gold (Au) into the main face portion of planar structures adjacent to the surface of the abovementioned pn junction disposed therein according to diffusion or ion implantation technique to form recombination centers in the diffused or implanted portion or by irradiating semiconductor substrates with radioactive radiation having high energy such as X rays, γ-rays, electron beams or the like to form lattice defects therein to increase the number of recombination centers. However, it has been difficult to apply either of these measures to the practical manufacturing of semiconductor thermally sensitive switching elements for the following reasons: Heavy metals, for example, gold forming recombination centers in semiconductors have generally the diffusion coefficient very high in both semiconductors and oxide films. Further suitable diffusion masks have not been available and so on. As a result, it has been practically difficult to introduce atoms of such a heavy metal into only near to the surface region or one portion of the pn junction by diffusion technique with good reproducibility. Also the introduction of gold atoms or the like through the use of ion implantation technique has not necessarily provided effective means because, in order that the introduced gold atoms are operated as recombination centers through their activation, heat treatment at an elevated temperature is required after the ion implantation. During this heat treatment the gold atoms would have been diffused into a region other than the desired portion of the pn junction for the reasons similar to those above described.

Also radioactive radiations have generally the very strong penetration power in both semiconductor crystals and surface passivations films such as a silicon dioxide film. As a result, any suitable mask for radioactive radiation has not been yet provided. Accordingly, it has been difficult to form a low lifetime region only in the desired region of semiconductor substrates adjacent to the surface of the desired pn junction or one portion thereof through the irradiation with radioactive radiation. In addition, it has been very difficult to form the low lifetime region only in one specified region of semiconductor substrates according to any of known techniques. It is very desirable to enable the formation of a low lifetime region in a predetermined portion of the particular semiconductor substrate alone.

Accordingly, it is an object of the present invention to provide a new and improved process of producing a semiconductor thermally sensitive switching element effecting the switchover at a sufficiently low temperature by forming a semiconductor region in which the lifetime of carriers is short in one portion of a region of a desired pn junction disposed in a semiconductor substrate.

SUMMARY OF THE INVENTION

The present invention provides a process of producing a semiconductor thermally sensitive switching element having at least one pnpn thyristor structure in a semiconductor substrate, including a pn junction exposed to one main face of the semiconductor substrate and reversely biased in an OFF state of the element and shifted from its OFF to its ON state in response to a rise in temperature, which process comprises the steps of disposing a first implantation control film on at least a portion of the main face of the semiconductor substrate having the pn junction exposed thereto while disposing a second implantation control film on the remaining portion of the main face, the first implantation control film having a low penetration stopping capability to implanted ions, the second implantation control film having a high penetration stopping capability to the implanted ions, and implanting ions of an element with a predetermined implantation energy into the semiconductor substrate through the first and second implantation control films to form a semiconductor region including lattice defects only in a portion of the semiconductor substrate overlaid with the first implantation control film.

Preferably, the first implantation control film may have a thickness smaller than that of the second implantation control film and the ions are implanted into the semiconductor substrate with such energy that the ions have their projected range ($R_p$) larger than the thickness of the first implantation control film and smaller than the thickness of the second implantation control film.

Advantageously, the ions to be implanted are formed of an element inert within the semiconductor substrate. That element is selected from the group consisting of argon (Ar), neon (Ne), xenon (Xe), nitrogen (N) and silicon (Si).

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENT

Figure 1A:
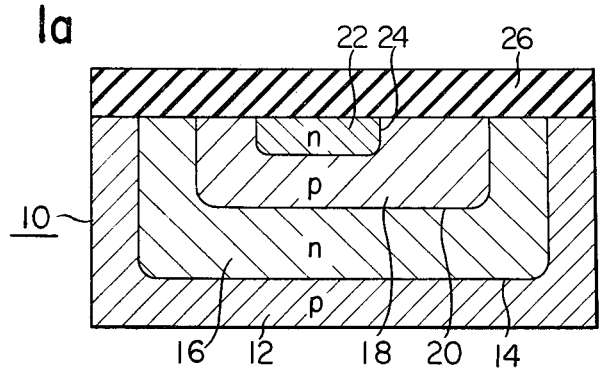
FIGS. 1a, 1b, 1c and 1d are cross sectional views of a semiconductor wafer illustrated in the successive manufacturing steps of a process of producing a semiconductor thermally sensitive switching element in accordance with the principles of the present invention.

Upon practicing the present invention, an n type silicon wafer is first prepared and a p and an n type impurities are successively and selectively diffused into predetermined portions of a pair of main opposite faces of the wafer in the manner well known in the art to form a pnpn junction structure such as shown in FIG. 1a.

The arrangement illustrated comprises an n type silicon substrate generally designated by the reference numeral 10 including a p type emitter region 12 of a U-shaped cross section formed by diffusing a p type impurity into the substrate 10 through the entire area of one of main opposite faces, in this case, a lower main face thereof as viewed in FIG. 1 and selectively diffusing the p type impurity in a predetermined pattern into the substrate 10 through the other or upper main face thereof. The p type emitter region 12 forms a first emitter junction 14 with the remaining portion of the n type substrate 10 forming an n type base region 16.

Then a p type impurity is selectively diffused in a predetermined pattern into the n type base region 16 to form a p type base region 18 therein and also a collector junction 20 therebetween. Following this, an n type impurity is selectively diffused in a predetermined pattern into the p type base region 18 to form an n type emitter region 22 therein along with a second emitter junction 24 between both regions.

The junctions 14, 20 and 24 are exposed on the edges to the upper main face of the substrate 10. In order protect the exposed edges of the junctions 14, 20 and 24, a suitable surface passivation film 26, for example, a silicon dioxide (SiO$_2$) film is disposed on the upper main face of the substrate 10.

In this way a planar thyristor structure has been completed.

As this surface passivation film, one may utilize silicon dioxide films used in forming the p type emitter region 12, the p type base region 18 and the n type emitter region 22 according to selective diffusion technique and left intact. Further those silicon dioxide films may have disposed thereon another silicon dioxide film with or without phosphorus doped, silicon nitride (Si$_3$N$_4$) or the like formed into a thick film according to chemical vapor deposition (which is abbreviated hereinafter to "CVD") technique for the purpose of enhancing the passivation effect.

In the arrangement of FIG. 1a the surface passivation film 26 is disposed on the upper main face of the substrate 10 after all the impurity diffusing steps have been completed, and formed of silicon dioxide films disposed on the upper main substrate face for use in selective diffusion and overlaid with a thick silicon dioxide film formed according to CVD technique. Thus the film 26 is of a stratiform structure and the total thickness thereof may amount, for example, to 10,000 Å or more.

Figure 1B:
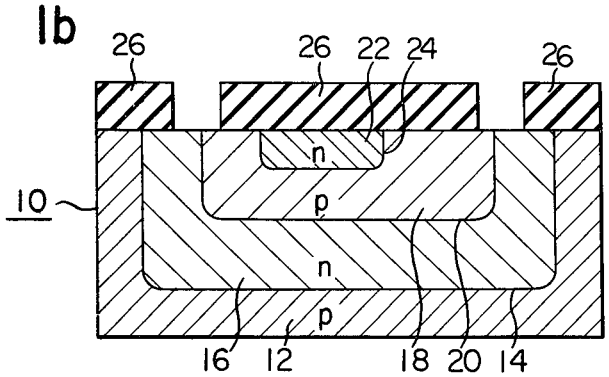

The present invention contemplates to form a low lifetime region in that portion of the substrate 10 disposed on a region of the edge of the collector junction 22 formed on the interface of the n and p type regions 18 and 22 respectively, exposed to the main substrate face by in creasing the number of lattice defects to shorten the lifetime of carriers. Therefore any suitable etching solution or plasma etching is used to remove selectively the silicon dioxide film 26 to a width sufficient to include the edge of the collector junction 20 exposed to the main substrate face and the adjacent portion of the main substrate face. Thus the edge of the collector junction 20 and the adjacent portion of the main substrate face are exposed as shown in FIG. 1b. The width may be, for example, of 20 μm.

Figure 1C:
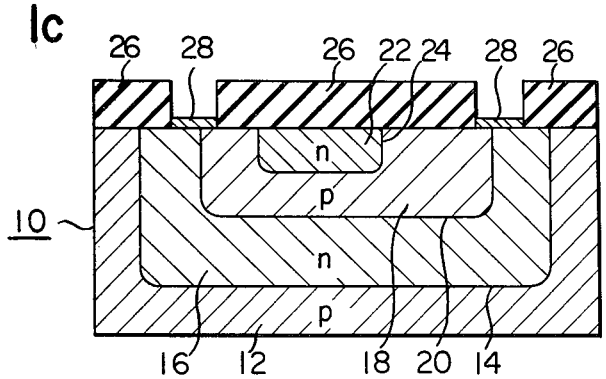

Then, as shown in FIG. 1c, a relatively thin silicon dioxide film 28 is disposed on the exposed portion of the main substrate face in the manner well known in the art to form a surface passivation film on the exposed surface portion of the substrate 10. The film 28 may be, for example, about 1,000 Å thick.

From the foregoing it will be understood that the capability of the thin surface passivation film 28 to stop implanted ions in the later step of implanting ions into the substrate 10 is far lower than that of the thick surface passivation film 26.

Figure 1D:
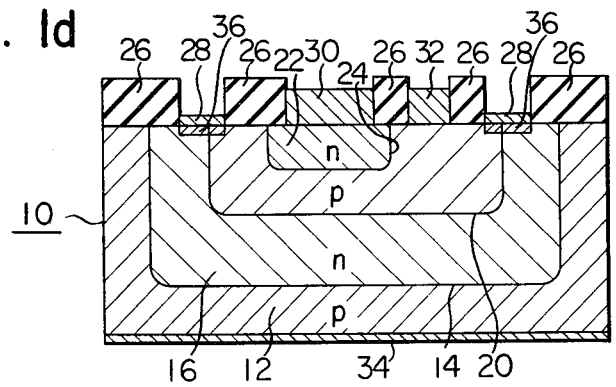

Subsequently, those portions of the silicon dioxdie film 26 disposed on both the n type emitter region 22 and the p type base region 18 are etched away into predetermined patterns in the manner well known in the art until those portions of both regions overlaid with such portions of the film 26 are exposed. Thereafter any suitable metallic material such as aluminum is deposited in predetermined pattern on the now exposed surface portions of the n type emitter region 22 and the p type base region 18 in the well known manner to form a cathode electrode 30 and a gate electrode 32 disposed in ohmic contact with the regions 22 and 18 respectively as shown in FIG. 1d.

In order that the electrodes 30 and 32 increase in adhesion to the silicon substrate 10 and have surely the ohmic property required for electrodes, both electrodes are subjected to suitable heat treatment. For example, the electrodes 30 and 32 may be sintered at 500° C. for about thirty minutes. Also gold or the like is evaporated on the lower main face of the substrate 10 in the manner well known in the art and suitably sintered resulting an anode electrode 34.

The next succeeding step is to implant charged particles or ions of any of argon (Ar), neon (Ne), xenon (Xe), nitrogen (N), silicon (Si) etc. into the substrate 10 through the thick and thin silicon oxide films 26 and 28 respectively. At that time, the ion implantation is accomplished with such an implantation energy that the projected range ($R_p$) of the charged particles or ions in the silicon dioxide films becomes larger than the thickness of the thin oxide film 28 and far smaller than the thickness of the thick oxide film 26.

As above described, the low lifetime region increased in the number of lattice defects is required only to be formed in that portion of the substrate 10 located directly below and adjacent to the edge of the collector junction 20 exposed to the main face of the substrate 10. Therefore, any element may be employed as long as its ions form efficiently a large number of lattice defects in a semiconductor region into which the ions are implanted.

It has been found that the satisfactory result is given by monovalent or multivalent ions of at least one element selected from the group consisting of argon (Ar), neon (Ne), xenon (Xe), nitrogen (N) and silicon (Si). Also one may use phosphorus, boron or arsenic ions $P^+$, $B^+$ or $As^+$. Since phosphorus (P), boron (B) and arsenic (As) act as impurities determining the conductivity type of single silicon crystals, the implantation of ions of any of those elements causes a change in shape of the collector junction 20 resulting in a fear that the junction 20 will reduce in dielectric strength. Accordingly, it is desirable to avoid the use of ions of any element determining the conductivity type of semiconductors and it is preferable to use ions of any of inert elements $Ar^+$, $Ne^+$, $Xe^+$ or the like, because those elements are inert in semiconductor substrate.

As an example, the present invention will now be described in conjunction with argon ions $Ar^+$ but it is to be understood that the present invention is equally applicable to ions of neon, xenon, nitrogen and silicon. The argon ions $Ar^+$ have the projected range $R_p$ in silicon oxide film equal to about 1,700 Å with an implantation energy of say 200 KeV.

Therefore, where the argon ions $Ar^+$ are implanted in the arrangement of FIG. 1d with an implantation energy of 200 KeV, low lifetime regions including large number of lattice defects can be formed in that portion of the substrate 10 located directly below the thin silicon oxide film 28. At that time, the implanted argon ions $Ar^+$ do not at all reach those portions of the substrate 10 overlaid with the thick silicon dioxide film 26 thereby to form no lattice defect therein. As a result, the characteristics of the junctions 14 and 28 are not adversely affected by the ion implantation. In other words, the junctions 14 and 28 are prevented from increasing in recombination current during the forward bias, decreasing in dielectric strength during the reverse bias and so on.

From the foregoing it is seen that, according to the present invention, lattice defects are formed only in a surface region of the substrate 10 on and adjacent to the edge of the collector junction 20 exposed to the main substrate face thereby to form a low lifetime region 34 therein as shown in FIG. 1d. This makes it possible to increase sharply a reverse leakage current through the collector junction 20.

It has been found that the reverse leakage current has a magnitude dependent upon the number of the argon ions $Ar^+$ implanted and that the more the number of the argon ions implanted the higher the reverse leakage current. This is because the larger the number of implanted ions the larger the number of the lattice defects acting as recombination centers will be.

A plurality of pnpn thyristor structures such as shown in FIG. 1a were produced under the suitable diffusion conditions to include the collector junction such as the junction 20 whose area was of $7.8 \times 10^{-4}$ cm$^2$. Then argon ions $Ar^+$ were implanted into the thyristor structures with an implantation energy of 200 KeV. With a voltage of 5 volts applied across the collector junction, a reverse leakage current $I_R$ through that junction was measured at a temperature of 27° C. while the number of implanted ions Q was differently changed. The results of the measurements are illustrated in FIG. 2 wherein the axis of ordinates represents the reverse leakage current in amperes in a logarithmic unit and the axis of abscissas represents the number of implanted ions Q per square centimeter in a logarithmic unit. juntion 20.

Figure 2:
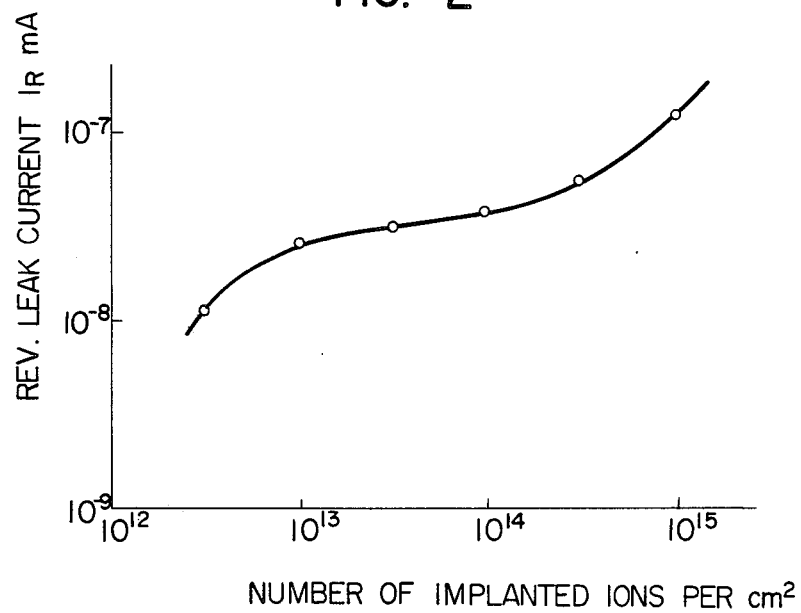
FIG. 2 is a graph illustrating the relationship between the number of implanted ions and a leakage current through a collector junction of a pnpn thyristor structure produced in accordance with the process of the present invention.

In FIG. 2 the leakage current will read to be of $3.9 \times 10^{-8}$ ampere, for example, with the number of implanted ions Q of $1 \times 10^{14}$ per square centimeter. In thyristors of the pnpn structure produced according to the same manufacturing steps as those above described and including no argon ion $Ar^+$ implanted, the leakage current through the collector junction was on the order of about $5 \times 10^{-11}$ ampere. Therefore it is apparent that the present invention can increase the reverse leakage current by a factor of about eight hundreds (800). Also, even where the number of implanted ions is as small as $3 \times 10^{12}$ per square centimeter, the leakage current has a magnitude of $1.1 \times 10^{-8}$ as seen in FIG. 2. In the latter case the leakage current can be increased by a factor of about two hundreds (200).

Figure 3:
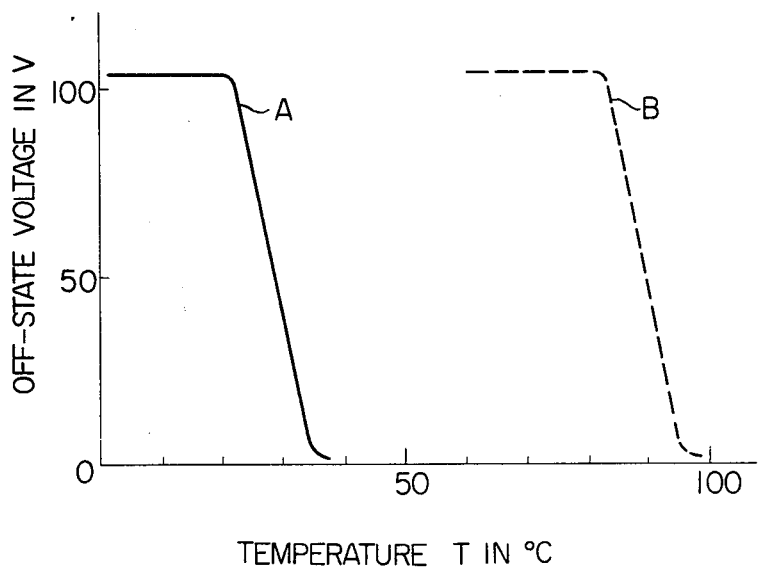
FIG. 3 is graph illustrating the relationship between a temperature and an off-state voltage obtained with the present invention in comparison with the prior art practice.

An off-state voltage was measured at different temperatures with pnpn elements produced as above described in connection with FIG. 1 and having implanted thereinto $1 \times 10^{14}$ argon ions ($Ar^+$) per square centimeter and also with pnpn elements identical to those above mentioned but not at all including implanted argon ions. The results of the measurements is shown in FIG. 3 wherein the off-state voltage $V_{Bo}$ in volts is plotted in ordinate against the temperature T in Cent. degrees in abscissa. Solid curve A depicts the present invention and broken curve B describes the latter pnpn elements.

In FIG. 3, it is assumed that a switching temperature $T_s$ is defined by a temperature at which the off-state voltage $V_{Bo}$ decreases to 50 volts. Then the pnpn switching element of the present invention has its switching temperature of about 30° C. while the similar switching element not subjected to the ion implantation has its switching temperature of about 90° C. Therefore the present invention can decrease the switching temperature by about 60° C. That is, the present invention provides a semiconductor thermally sensitive switching element having an off-state voltage decreased at a sufficiently low temperature or adjacent to room temperature to effect the switchover at the low temperature.

From the foregoing it is seen that the present invention provides a semiconductor thermally sensitive pnpn switching element increased sharply in reverse leakage current through a collector junction involved thereby to effect the switchover at a low temperature. Also, as apparent from FIG. 2, the present invention can adjust the reverse leakage current through the collector junction by changing the number of ions implanted. Therefore, after pnpn structures have been produced in accordance with the same manufacturing steps and then provided with electrodes different switching temperatures can be imparted to the resulting semiconductor thermally sensitive switching elements by varing the number of ions implanted thereinto. This results in the advantage that, upon manufacturing semiconductor thermally sensitive switching elements having different switching temperatures as determined by corresponding specifications, the diffusion steps can be standardized thereby to reduce manufacturing costs.

While the present invention has been illustrated and described in conjunction with a single preferred embodiment thereof it is to be understood that numerous changes and modifications may be resorted to without departing from the spirit and scope of the present invention. For example, the present invention is equally applicable to the mesa type pnpn structure of semiconductor thermally sensitive switching elements. Also in order to producing simultaneously a plurality of semiconductor thermally sensitive switching elements effecting the switchover at different temperatures, one may prepared a plurality of semiconductor substrates including pnpn thyristor structures such as shown in FIG. 1a formed by the same manufacturing steps. Then each of the semiconductor substrates thus prepared is processed as above described in conjunction with FIGS. 1b through 1c. However the number of implanted ions are different from one to another of the substrates.

What we claim is:

1. A process of producing a semiconductor thermally sensitive switching element having at least one pnpn thyristor structure in a semiconductor substrate, including a pn junction exposed to one main face of said semiconductor substrate and reversely biased in an OFF state of the element, and shifted from its OFF to its ON state in response to a rise in temperature which process comprises the steps of disposing a first implantation control film on at least a portion of said main face of said semiconductor substrate having said pn junction exposed thereto while disposing a second implantation control film on the remaining portion of said main face, said first implantation control film having a low penetration stopping capability to implanted ions, said second implantation control film having high penetration stopping capability to said implanted ions, and implanting ions of an element with a predetermined implantation energy into said semiconductor substrate through said first and second implantation control films to form a semiconductor region including lattice defects only in a portion of said semiconductor substrate overlaid with said first implantation control film.

2. A process of producing a semiconductor thermally sensitive switching element as claimed in claim 1 wherein said pn junction is a collector junction disposed in said pnpn thyristor structure.

3. A process of producing a semiconductor thermally sensitive switching element as claimed in claim 1 wherein said first implantation control film has a thickness smaller than that of said second implantation control film, and said ions are implanted into said semiconductor substrate with such energy that said ions have the projected range larger than the thickness of said first implantation control film and smaller than the thickness of said second implantation control film.

4. A process of producing a semiconductor thermally sensitive switching element as claimed in claim 1 wherein said ions are caused from an element inert in said semiconductor substrate.

5. A process of producing a semiconductor thermally sensitive switching element as claimed in claim 4 wherein said element is at least one element selected from the group consisting of argon (Ar), neon (Ne), xenon (Xe), nitrogen (N) and silicon (Si).

6. A process of producing a semiconductor thermally sensitive switching element as claimed in claim 3 wherein said first and second implantation control films are of silicon dioxide.

7. A process of producing a semiconductor thermally sensitive switching element as claimed in claim 6 wherein said first implantation control film has a thickness of about 1,000 Å and said second implantation control film has a thickness of at least 10,000 Å.

8. A process of producing a semiconductor thermally sensitive switching element as claimed in claim 7, wherein argon ions Ar+ are implanted into said semiconductor substrate with an implantation energy of 200 KeV.

9. A process of producing simultaneously a plurality of semiconductor thermally sensitive switching elements effecting the switchover at different temperatures, comprising the steps of preparing a plurality of semiconductor substrates including pnpn thyristor structure as recited in claim 1 formed by the same manufacturing steps, and repeating the steps of disposing said implantation control films on, and implanting said ions into each of said semiconductor substrates as recited in claim 1 with the number of implanted ions different from one to another of said semiconductor substrates.

* * * * *